United States Patent
Kao et al.

(10) Patent No.: US 6,323,089 B1
(45) Date of Patent: Nov. 27, 2001

(54) SEMICONDUCTOR MEMORY ARRAY WITH BURIED DRAIN LINES AND PROCESSING METHODS THEREFOR

(75) Inventors: Dah-Bin Kao, Palo Alto; Loc B. Hoang, San Jose; Albert T. Wu, Palo Alto; Tung-Yi Chan, San Jose, all of CA (US)

(73) Assignee: Winbond Electronics Corp. America, San Jose, CA (US)

( * ) Notice: Subject to any disclaimer, the term of this patent is extended or adjusted under 35 U.S.C. 154(b) by 0 days.

(21) Appl. No.: 09/309,242

(22) Filed: May 10, 1999

Related U.S. Application Data

(62) Division of application No. 08/976,751, filed on Nov. 24, 1997, now Pat. No. 6,211,547.

(51) Int. Cl.[7] ............................................. H01L 21/8247
(52) U.S. Cl. ................................................ 438/260; 438/594
(58) Field of Search ................................. 438/257–267

(56) References Cited

U.S. PATENT DOCUMENTS

| | | | |
|---|---|---|---|
| 5,029,130 | 7/1991 | Yeh | 365/185 |
| 5,045,488 | 9/1991 | Yeh | 437/43 |
| 5,063,172 | * 11/1991 | Manley . | |
| 5,274,588 | 12/1993 | Manzur et al. | 365/185 |
| 5,280,446 | 1/1994 | Ma et al. | 365/185 |
| 5,284,784 | * 2/1994 | Manley . | |
| 5,502,321 | 3/1996 | Matsushita | 257/316 |
| 5,521,110 | * 5/1996 | Gill . | |
| 5,544,103 | 8/1996 | Lambertson | 365/185.15 |
| 5,572,054 | 11/1996 | Wang et al. | 257/322 |
| 5,633,185 | * 5/1997 | Yiu et al. | 438/258 |
| 5,756,384 | * 5/1998 | Tseng | 438/257 |
| 5,986,934 | 11/1999 | Kao et al. | 365/185.18 |
| 6,013,926 | 1/2000 | Oku et al. | 257/284 |
| 6,093,603 | * 7/2000 | Yamaguchi | 438/257 |

OTHER PUBLICATIONS

Sohrab Kianian et al., "A Novel 3 Volts–Only, Small Sector Erase, High Density Flash $E^2$ PROM" 1994 Symposium on VLSI Technology Digest of Technical Papers, p. 71.

Y. Ma et al., "A Novel High Density Contactless Flash Memory Array Using Split–Gate Source–Side–Injection Cell For 5V–Only Applications" 1994 Symposium on VLSI Technology Digest of Technical Papers, p. 49.

* cited by examiner

*Primary Examiner*—Richard Booth
(74) *Attorney, Agent, or Firm*—Justin Boyce; Claude A. S. Hamrick; Oppenheimer Wolff & Donnelly LLP

(57) ABSTRACT

A semiconductor memory array and methods therefor is provided herein comprising a substrate; a plurality of memory cell field effect transistors formed on said substrate and being arranged thereon into rows and columns of transistors, each transistor includes a channel region interposed between drain and source regions, and overlaid by a control gate region; a plurality of first diffused elongated regions formed within said substrate that electrically connect in common the drain regions of transistors in respective columns; a plurality of second diffused elongated region formed within said substrate that electrically connect in common the source regions of transistors in respective columns; and a plurality of elongated conductive line formed over said substrate that electrically connect in common the control gate regions of transistors in respective rows.

13 Claims, 13 Drawing Sheets

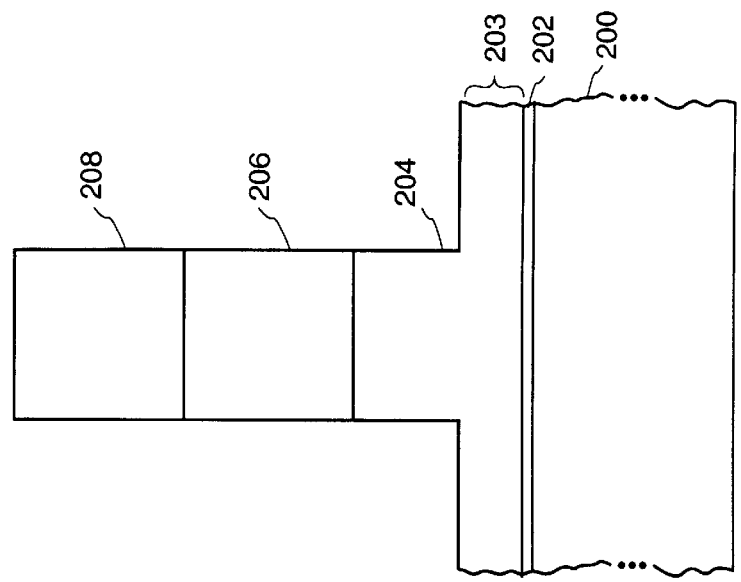
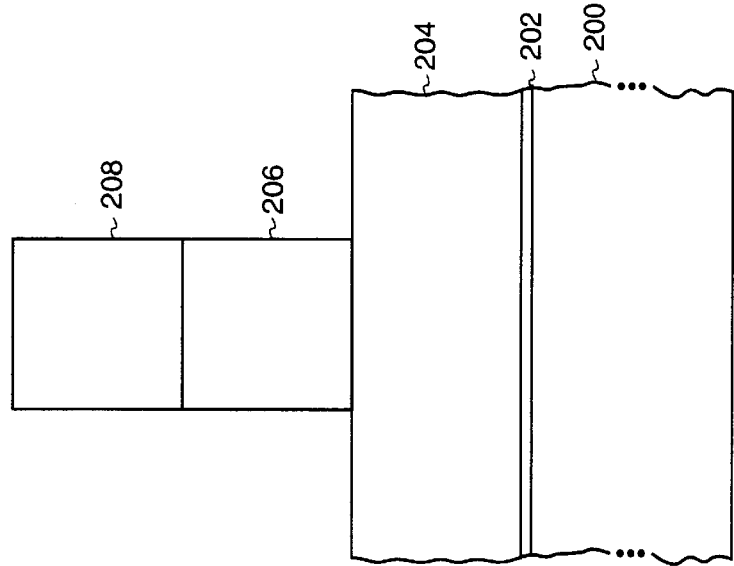
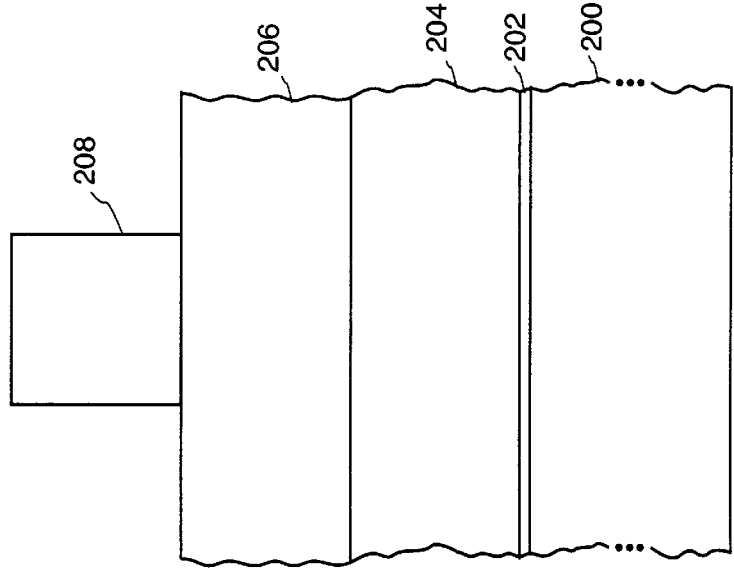

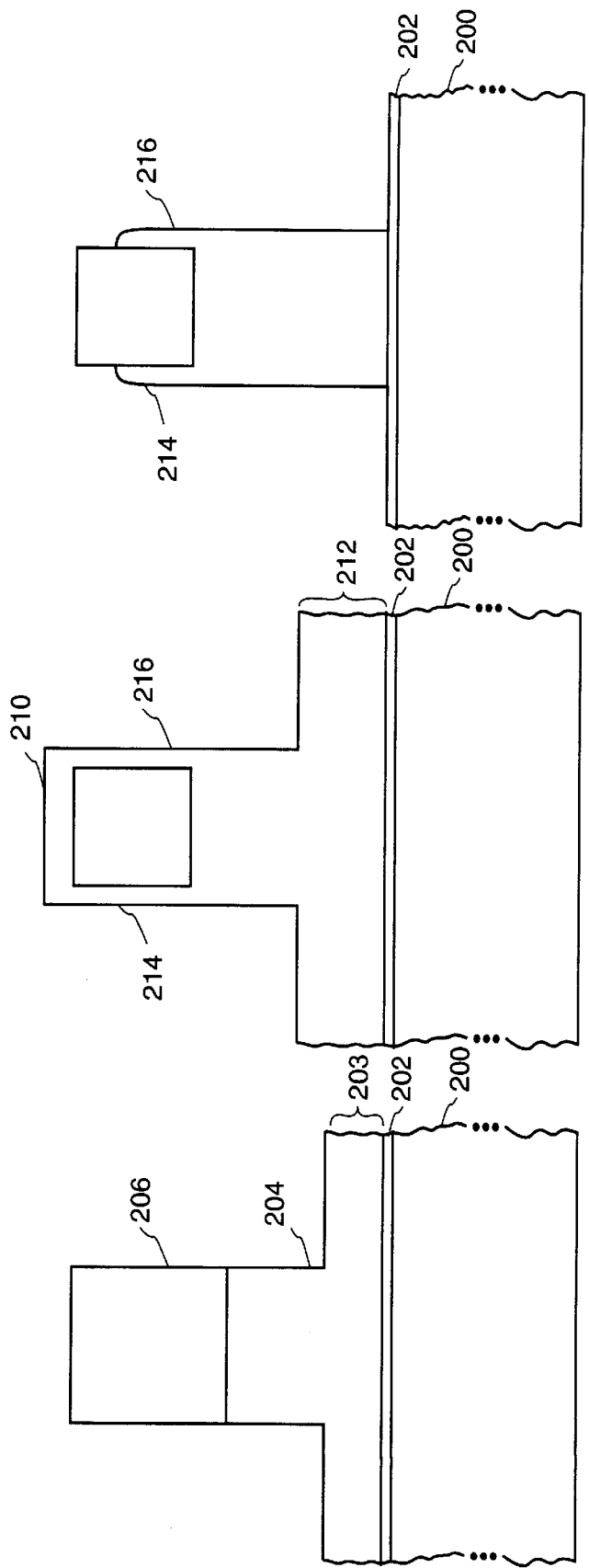

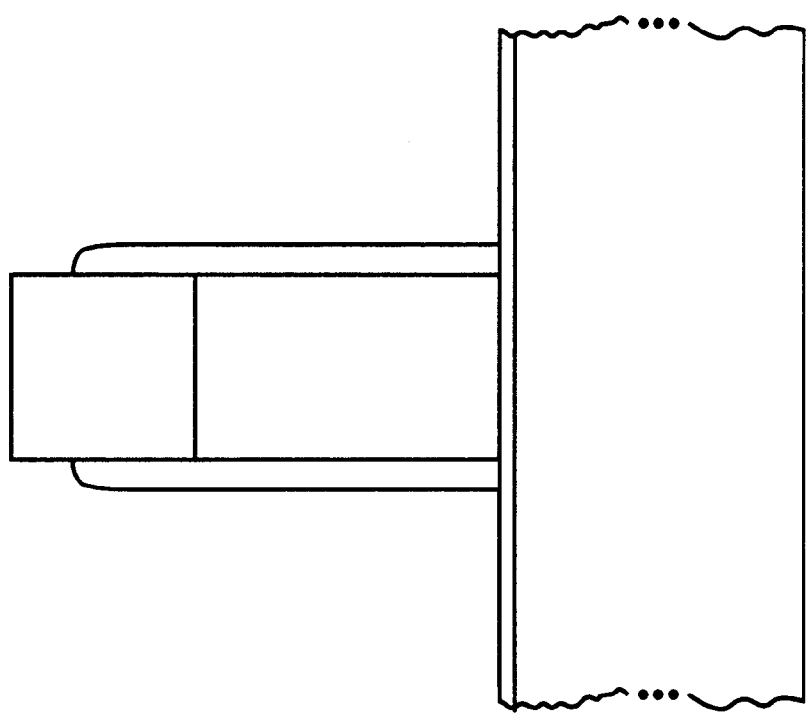

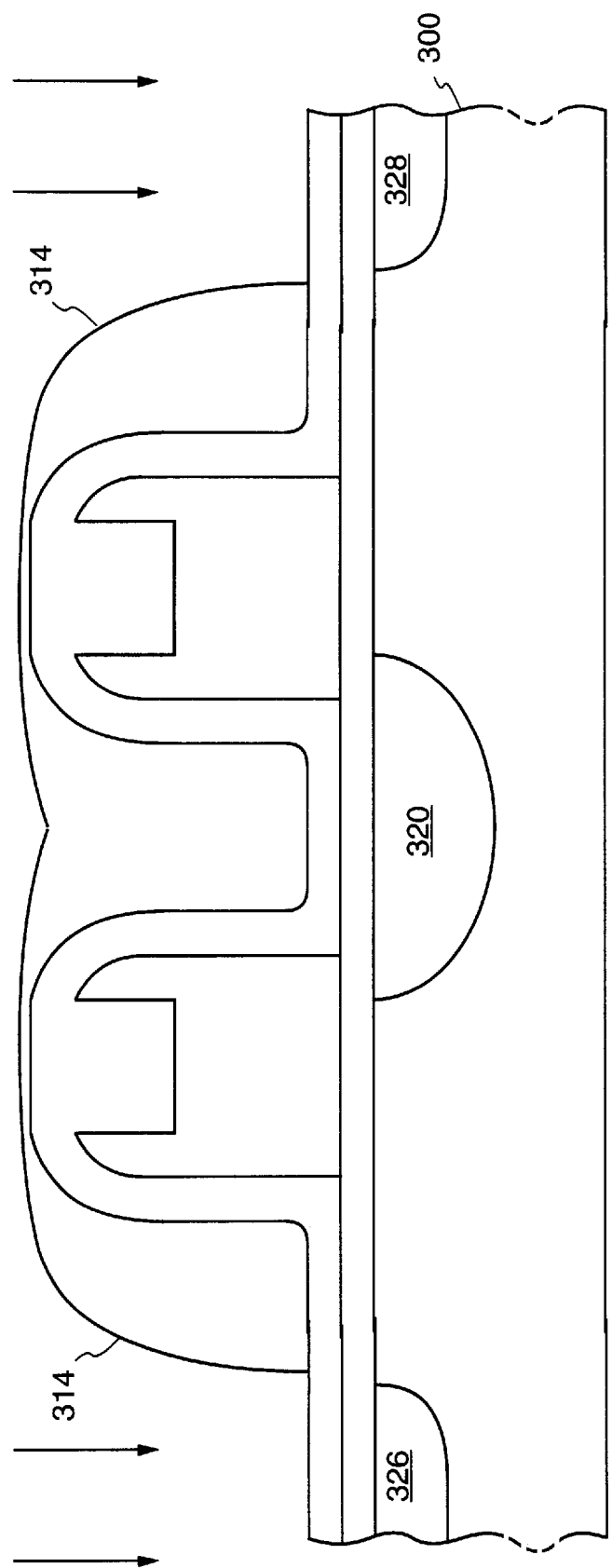

SEMICONDUCTOR MEMORY ARRAY WITH BURIED DRAIN LINES AND PROCESSING METHODS THEREFOR

REFERENCE TO RELATED APPLICATIONS

This is a division of U.S. application Ser. No. 08/976,751, filed Nov. 24, 1997 now U.S. Pat. No. 6,211,547 and entitled "Semiconductor Memory Array with Buried Drain Lines and Processing Methods Therefor".

FIELD OF INVENTION

This invention generally relates to semiconductor memory circuits, and in particular, to an electrically erasable programmable read only memory circuit (EEPROM) that includes buried bitlines for decreasing the size and cost of manufacturing the memory circuit and processing methods therefor.

BACKGROUND OF THE INVENTION

Semiconductor memory array circuits, and specifically, electrically erasable programmable read only memories (EEPROMs), are rapidly growing in popularity today. They are extensively used in modern digital and computer systems for storing data and instructional codes that manipulate data to perform the desired functions.

Referring to FIG. 1, a block and schematic diagram of a prior art EEPROM memory array circuit 10 is shown with associated circuitry for addressing and performing memory operations on the memory array circuit. The EEPROM memory array circuit 10 comprises a plurality of memory cells arranged in an array orientation, including rows and columns of memory cells. Each memory cell consists of a field effect transistor (FET) having a drain (D), a source (S), and a gate (G), as it is conventionally known. The gate of an EEPROM memory cell FET typically consists of a floating gate (FG) and a control gate (CG). Some prior art EEPROM memory circuits further include an erase gate (EG) in addition to the floating and control gates (not shown in the prior art memory circuit of FIG. 1). As it is well known, the floating gate typically is the portion of the memory cell that holds the data content in the form of stored electron charges. The control gate is used for addressing the memory cell in order to perform memory operations on the cell, including writing, erasing and reading operations.

As explained earlier, the memory cell FETs of the prior art EEPROM memory array circuit 10 are arranged in an array orientation, which includes rows and columns of memory cell FETs. The memory cell FETs within a row typically have their respective control gates (CG) connected in common by a conductive line, typically designated as the wordline. The memory cell FETs within a column typically have their respective drains (D) connected in common by another conductive line, typically designated as the bitline. Usually, the source (S) of each memory cell FETs are all connected in common, and is designated as the common source. Each memory cell typically includes its own individualized floating gate (FG). Although as drawn in FIG. 1 the columns of the prior art EEPROM memory array 10 are shown to be horizontal, and the rows are shown to be vertical, the memory circuit 10 was drawn this way to schematically illustrate the structural orientation of the memory array, as will be explained in more detail later.

As it is conventionally known, the bitlines of the prior art EEPROM memory array 10, designated herein as BL1 sequentially through BLm, including a BLi which designates the bitline corresponding to the i-th column of memory cell FETs, are typically coupled to the outputs of a column address decoder/Y-Mux 14. The wordlines, designated herein as WL1 sequentially through WLn, including a WLj which designates the wordline corresponding to the j-th row of memory cell FETs, are coupled to the outputs of a row address decoder 12. As it is conventionally known, the row and column address decoders 12 and 14 are employed for addressing a particular row and column of memory cell FETs that are both common to a selected memory cell FET for which a memory operation is to be performed on, such as a writing, erasing or reading operation. Also included is a memory operation circuit 16 used for performing memory operations on the memory cells of the array. The memory operation circuit 16 includes a sense amplifier 18 and output and input buffers 20 and 22, as it is conventionally known.

Referring to FIG. 2, a structural and schematic diagram of a portion of the prior art EEPROM memory array 10 is shown. The portion shown includes memory cell FETs that are in rows common to wordlines WL(j−2) sequentially through WL(j+3), and memory cell FETs that are in column common to bitlines BL(i−2) sequentially through BL(i+3). Structurally, the memory cell FETs of the prior art EEPROM memory array 10 are formed within and on a silicon substrate 24. The sources (S) of the memory cell FETs are formed as diffusion lines within the substrate 24, and run parallel to the wordlines to connect in common the sources of memory cells in each of the rows. That is, the memory cell FETs that are within a row of memory cells have their sources connected in common by the source diffusion line, such as source diffusion lines SL(K−1), SL(K) and SL(K+1) shown in FIG. 2. In addition, pairs of adjacent memory cell FETs along the bitline direction have common sources connected to their corresponding source lines. For example, as shown in FIG. 2, the memory cell FETs common to wordlines WL(j) and WL(j+1) have their sources connected in common by source diffusion line SL(k).

The floating gates (FGs) of the memory cell FETs of the prior art EEPROM memory array 10 are typically formed as islands of polycrystalline silicon formed over a portion over the FETs' channel in a split-gate type EEPROM, which herein is serving as an example, adjacent to respective diffused source lines. Each memory cell FET includes its own floating gate (FG) and is separated from the substrate by a thin oxide layer, as it is conventionally known.

The wordlines (WL1–WLn) of the prior art EEPROM memory cell FETs are formed as polycrystalline silicon conductive lines situated over the substrate 24. Portions of each polycrystalline wordline are situated over respective memory cell FETs which form the control gates of FETs in a respective row of memory cells. In the split-gate configuration, a portion of the polycrystalline silicon control gates are formed over the portion of a respective channel that is not underlying a respective floating gate (FG), and is separated from the substrate by a thin oxide, as it is conventionally known. Another portion of the polycrystalline control gate (CG) is formed over a respective floating gate (FG) and is separated therefrom also by a thin oxide layer, as it is conventionally known.

The bitlines (BL1–BLm) of the prior art EEPROM memory array 10 are formed as metal lines deposited over the substrate 24 and over the other elements of the memory cell FETs, and are separated therefrom by an insulating oxide layer. The polycrystalline bitlines connect in common the drains (D) of memory cell FETs in respective columns, where these drains are formed as diffused region within the substrate 24. In order to electrically connect the bitlines to the drains of the memory cell FETs, a contact needs to be made through an insulating layer and down to the diffused drain region of each memory cell FET. As it will be explained in more detail below, it is the size requirement of these contacts and the areas around the respective contacts that is an impediment to the further shrinking and densifying of the prior art EEPROM memory array circuit 10.

Referring to FIG. 3, a plan view of a portion of the prior art EEPROM memory array 10 is shown. Specifically, four memory cell FETs are shown having common wordlines WL(j) and WL(+1), and common bitlines BL(i) and BL(i+ 1). As discussed above, each memory cell FET includes a control gate (CG) formed as a portion of the polycrystalline silicon wordline, and floating gate (FG) formed as an island of polycrystalline silicon. Adjacent pairs of memory cell FETs along the bitline direction have their respective sources connected in common by the diffused source line SL(k). As it is conventionally known, memory cell FETs are separated from adjacent memory cell FETs along the wordline direction by a field oxide layer (FOX). Notably though, each memory cell FET includes diffused drain regions connected to respective bitlines by way of a drain contact.

Notice that the drain contact of each memory cell FET in the prior art EEPROM memory array 10 occupies a relative large area of the memory cell FET. This is because the drain contact region not only occupies the surface area of the drain contact, it also occupies an area between the drain contact and adjacent wordlines for the purpose of separating and insulating the drain contact from the conductive wordlines. If L1 is defined as the length of the drain contact and L2 is defined as the length of each space separating the drain contact from adjacent wordlines, then the length of the drain contact region is L1+(2×L2). Assuming a 0.45 micron design rule, typical values for L1 and L2 are about 0.45 and 0.3 microns, respectively. This results in a drain region having a length of 1.05 microns for each memory cell FET.

Because the trend today is to increase the memory array capacity of EEPROMs, more memory cells including their respective drain contact regions are produced within a given integrated circuit die size. When the number of drain contact regions is multiplied by the number of memory cell FETs in a given EEPROM memory array, the cumulative area of the drain contact regions occupy a substantial area of the memory array size.

Besides the larger cell size, the prior art device as shown in FIG. 3 also requires the floating gates to be fabricated as individual rectangles before the control gates are formed. With the trend of continuous scaling toward smaller devices, it becomes increasingly more difficult to minimize the corner rounding effects in making the rectangular floating gates during the lithography and etching process. The drain and source contact problem and the corner rounding effect problem both pose a severe limitation to the continuous reduction in scaling of such devices.

Therefore, there is a need to reduce or eliminate the drain contact region of memory cell FETs in order to decrease the overall size of an EEPROM memory array, or conversely, to increase the number of memory cell FETs per a given integrated circuit die size. Solutions to such needs would translate into cost savings for the EEPROM memory arrays.

OBJECT OF THE INVENTION

Therefore, it is a general object of the invention to provide a semiconductor memory array and methods therefor.

It is another object of the invention to provide a semiconductor memory array and method therefor that allows for further reduction in size of memory array area.

It is yet another object of the invention to provide a semiconductor memory array and method therefor that allows for further increasing of the memory array capacity for a given integrated circuit die size.

It is still another object of the invention to provide a semiconductor memory array and method therefor that does not require contacts for connecting substrate-overlying conductive lines to source or drain diffused regions of memory cell FETs formed within a substrate.

It is still another object of the invention to provide a semiconductor memory array and method therefor that includes columns of memory cell FETs having their respective drain and source regions connected in common by diffused source and drain conductive lines.

SUMMARY OF THE INVENTION

The above-mentioned objects and other objects are accomplished herein by the various aspects of the invention, wherein, briefly, a semiconductor memory array is provided herein comprising a substrate; a plurality of memory cell field effect transistors formed on said substrate and being arranged thereon into rows and columns of transistors, each transistor includes a channel region interposed between drain and source regions, and overlaid by a control gate region; a plurality of first diffused elongated regions formed within said substrate that electrically connect in common the drain regions of the transistors in respective columns; a plurality of second diffused elongated regions formed within said substrate that electrically connect in common the source regions of transistors in respective columns; and a plurality of elongated conductive line formed over said substrate that electrically connect in common the control gate regions of transistors in respective rows.

Another aspect of the invention includes a method of forming a pair of adjacent memory cell field effect transistors comprising the steps of forming a pair of floating gate electrode stripes over said substrate and in a manner that said pairs of floating gate electrode stripes are insulated from the substrate by a first insulating layer, said floating gate electrode stripes being spaced apart from each other in a first direction and being generally parallel to each other extending in a second direction generally orthogonal to said first direction; forming at least a first diffused elongated region extending within said substrate in said second direction in the space between said pair of floating gate electrode stripes; forming a pair of second diffused elongated region extending within said substrate generally along the second direction and on respective sides of said floating gate electrodes opposite the side where said first diffused region is formed, and forming an elongated conductive line extending generally in said first direction over said substrate and said floating gate electrodes, and separated therefrom by a second insulating layer.

Yet, another aspect of the invention includes a method of forming a floating gate electrode comprising the steps of depositing a first oxide layer over a substrate, a polysilicon layer over the first oxide layer, and a silicon dioxide layer over the polysilicon layer; placing a mask of predefined size and shape in a first direction; removing unmasked portion of the silicon dioxide layer and a certain amount of the polysilicon layer; removing said mask; depositing a second polysilicon layer over the silicon dioxide layer and the first polysilicon layer; and removing a certain amount of the first and second polysilicon layer.

Yet, another aspect of the invention includes a semiconductor memory array, comprising a substrate; and a plurality of memory cell field effect transistors formed on said substrate and being arranged into rows and columns of transistors, wherein each transistor includes a channel formed within said substrate and interposed between drain and source diffused regions, and further including a control gate formed over the substrate overlying at least a first portion of said channel, and wherein the transistors common to a column of transistors have their respective drain and source electrically connected to each other via buried conductive drain and source lines, and wherein the transistors common to a row of transistors have their respective control gates electrically connected to each other, and further including an absence of a connection from a first conductive layer overlying said substrate to either of said drain and source regions of said transistors.

BRIEF DESCRIPTION OF THE DRAWING

The above-mentioned objects and other objects and features of this invention and manner of attaining them will become apparent, and the invention itself will be understood by reference to the following description of the preferred embodiments of the invention taken in conjunction with the accompanying drawings, wherein:

FIGS. 7A through 7G are cross-sectional views of the processing steps in making a floating gate with sharp injecting edges, where such edges enhances electron tunneling and reduces the voltage of operation; and FIGS. 8A through 8F are cross-sectional sequential views of the method for forming a pair of adjacent memory cells of a memory array circuit as per an embodiment of the invention.

DETAILED DESCRIPTION OF THE PREFERRED EMBODIMENTS

Figure 4:
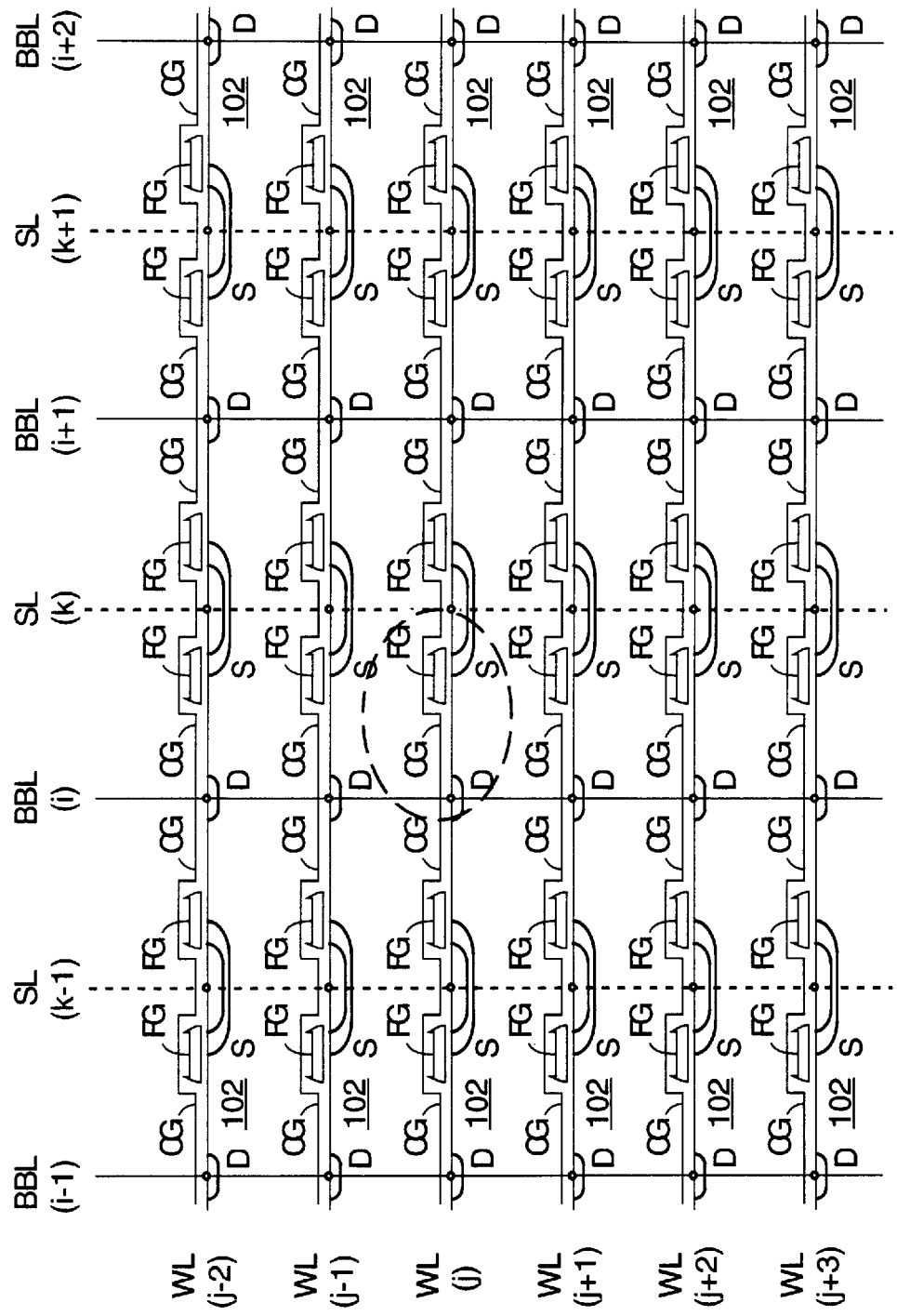
FIG. 4 is a structural and schematic diagram of an EEPROM memory array circuit as per an embodiment of the invention.

Referring to FIG. 4, a structural and schematic diagram of a semiconductor memory array 100 as per an embodiment of the invention is shown. The semiconductor memory array 100 includes a plurality of memory cell field effect transistors (FETs) preferably arranged in a row and column orientation, which are formed on a substrate 102, preferably of silicon material. Each of the memory cell transistors includes a channel formed within the substrate 102 interposed between a diffused source region (S) and diffused drain region (D). Each memory cell FET also includes a floating gate (FG) and a control gate (CG) formed above the substrate over each respective channel of the FET, and insulated therefrom by a thin oxide layer.

The semiconductor memory array 100 shown in FIG. 4, as an example of the invention, is of a split-channel type of memory array. That is, the floating gate (FG) of a memory cell FET is formed over a first portion of a respective channel for a respective diffused source region (S), and separated or insulated from the channel by a thin oxide layer, as it is conventionally done. A first portion of the control gate (CG) is preferably formed over the remaining portion of the channel (that is, extending from near the floating gate (FG) to the diffused drain region (D)), and separated or insulated from the floating gate by a second thin oxide layer. A second portion of the control gate (CG) is formed over the floating gate (FG) and is separated therefrom by a thin oxide layer. Although the split-channel type of memory cell FETs are shown to illustrate the invention, it shall be understood that the invention is also applicable to other types of semiconductor memory array, such as a non-split channel type where the floating gate extends over the length of the channel and the control gate overlies the floating gate.

As mentioned earlier, the memory cell FETs are formed in an orientation comprising a plurality of columns of memory cell FETs and a plurality of rows of memory cell FETs. For each column of memory cell FETs, the diffused source regions (S) of the memory cell FETs are preferably connected in common by a continuous elongated diffused conductive line (designated herein as the diffused source line and abbreviated "SL") extending in the column-direction within the substrate 102. For illustrative purposes, the diffused source lines SL(k−1), SL(k) and SL(k+1) are shown in FIG. 4 as a portion of the semiconductor memory 100. In the preferred embodiment, the diffused source region (S) of each memory cell FET is formed as a portion of each respective diffused source line (SL). Also in the preferred embodiment, the diffused source regions (S) of memory cell FETs common to pairs of adjacent columns are connected in common by respective diffused source lines.

Also for each column of memory cell FETs, the diffused drain regions (D) of memory cell FETs are preferably connected in common by a continuous elongated diffused conductive line (designated herein as the buried bitline and abbreviated "BBL") extending in the column-direction within the substrate 102. For illustrative purposes, the buried bitlines BBL(i−1), BBL(i), BBL(i+l) and BBL(i+2) are shown in FIG. 4 as a portion of the semiconductor memory array 100. In the preferred embodiment, the diffused drain region (D) of each memory cell FET is formed as a portion of each respective buried bitline (BBL).

For each row of memory cell FETs, the control gates (CG) of memory cell FETs are preferably connected in common by a continuous elongated conductive line (designated herein as the wordline and abbreviated "WL") extending in the row-direction and formed over the substrate and the floating gate. In the preferred embodiment, each wordline is formed of conductive polycrystalline silicon, or "polysilicon" for short. For illustrative purposes, the wordlines WL(j−2), WL(j−1), WL(j), WL(j+1), WL(j+2) and WL(j+3) are shown in FIG. 4. In the preferred embodiment, the control gate (CG) of each memory cell FET is formed as a portion of a corresponding word line(WL).

Note that in contrast to the prior art semiconductor memory array 10, the semiconductor memory array 100 of the invention does not require a contact from an overlying conductive line to either the diffused drain region (D) or the source drain region (S) of the memory cell FETs. In fact, in the preferred embodiment, there are no contacts between an overlying conductive line to either the diffused drain or source regions. The reason for this is that, in the semiconductor memory array 100 of the invention, columns of memory cell FETs have their source and drain regions connected in common by continuous elongated diffused drain and source lines (BBLs and SLs); therefore, there is no need for substrate-overlying conductive lines for electrically connecting in common the drain and source regions of column memory cell FETs. Because there is no need for such overlying conductive lines, there is also no need for forming contacts to the diffused drain and source regions of the memory cell FETs.

Because both the drain and source regions of the memory cell FETs of the semiconductor memory array 100 of the invention are formed from the elongated diffused drain and source lines (BBLs and SLs), and therefore, no contacts are required, there is a substantial reduction in the size of each of the memory cell FETs, which consequently results in substantial reduction in the size of the semiconductor memory array as compared to the prior art semiconductor memory array 10. Since there is a substantial reduction in size of the semiconductor memory array 100 of the invention, this leads to a substantial reduction in the cost of manufacturing the memory array. Also, it allows for the further densifying of the semiconductor memory array because more memory cells can be produced in a given integrated circuit die size.

Figure 5:
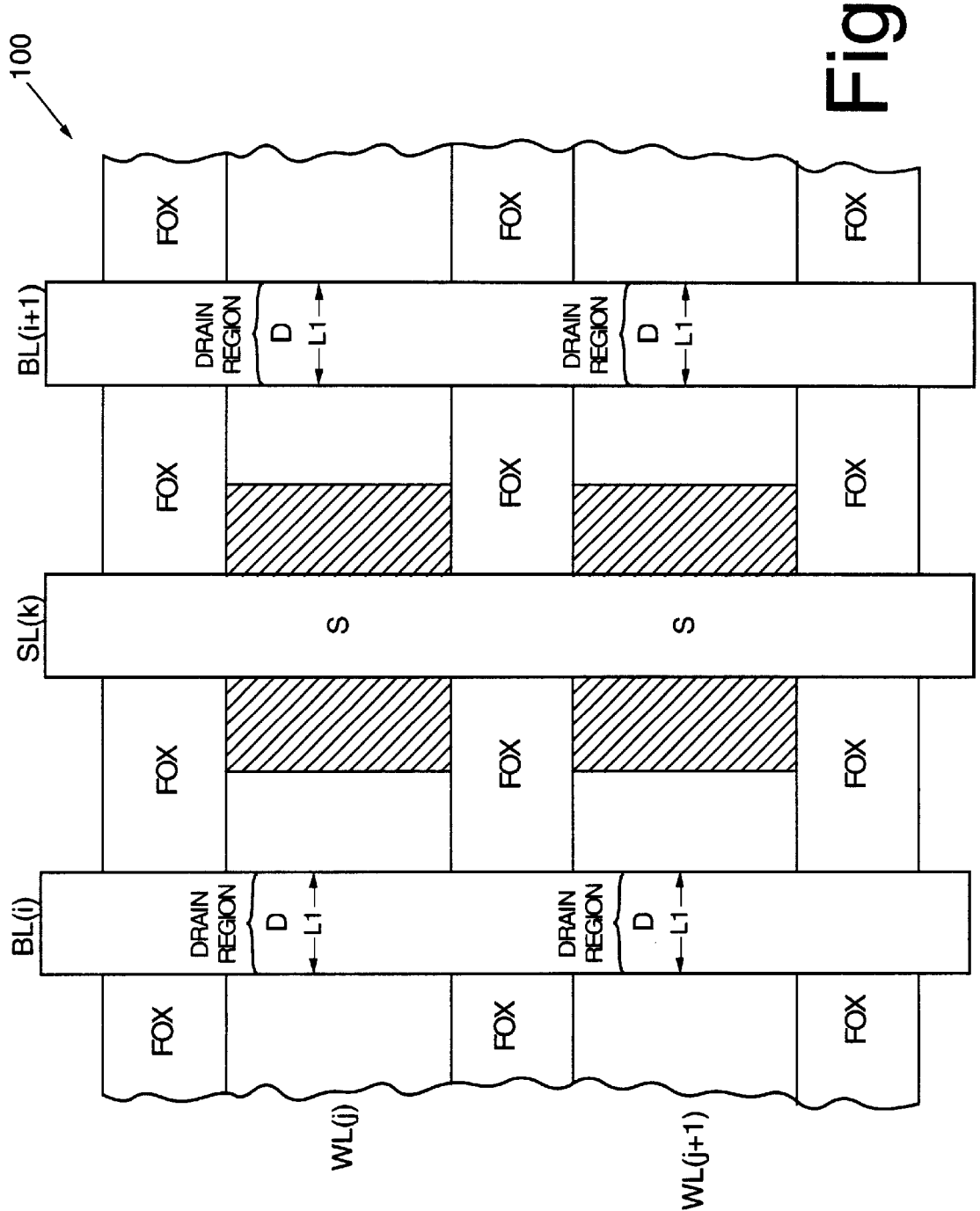
FIG. 5 is a top view of an EEPROM memory circuit as per an embodiment of the invention.

To illustrate the substantial reduction in the size of the semiconductor memory array 100 of the invention as compared to the prior art semiconductor memory array 10, FIG. 5 shows a top view of a portion of the semiconductor memory array 100 of the invention. Specifically, the portion shown of the semiconductor memory array 100 includes four memory cell FETs having in common buried bitlines BBL(i) and BBL(i+1), wordlines WL(j) and WL(j+1), and diffused source line SL(k).

Note that because there is no need for contacts in the semiconductor memory array 100 of the invention (except at the edges of the memory array), the drain regions are smaller in size as compared to that of the prior art memory array 10. This is because the drain regions of the memory cell FETs of the memory array 100 are electrically connected in common by the elongated diffused conductive lines (BBLs) which do not require additional insulating spacing to separate it from adjacent conductive lines. Therefore, the length of the drain region of the invention is simply L1. Whereas in the prior art semiconductor memory array 10, since column memory cell FETs have their drain regions connected in common by substrate-overlying conductive lines by way of contacts, there is a need for a pair of insulating spacing L2 for insulating and separating the contact from adjacent conductive wordlines.

For a 0.45 micron design rule, the length of the memory cell drain region of the memory array 100 of the invention is about 0.45 micron (L1); whereas, the length of the memory cell drain regions of the prior art memory array 10 is about 1.05 microns (L1+(2×L2)). If all other dimensions are equal for both memory arrays 10 and 100 and they include the same amount of memory cells, a reduction in size of about 18 percent with the use of the semiconductor memory array 100 of the invention results. This is a substantial size reduction where in today's memory designs, memory real estate is a precious commodity. This also leads to a substantial cost savings in the manufacturing for the memory array of the invention as compared to that of the prior art memory array.

Figure 1:
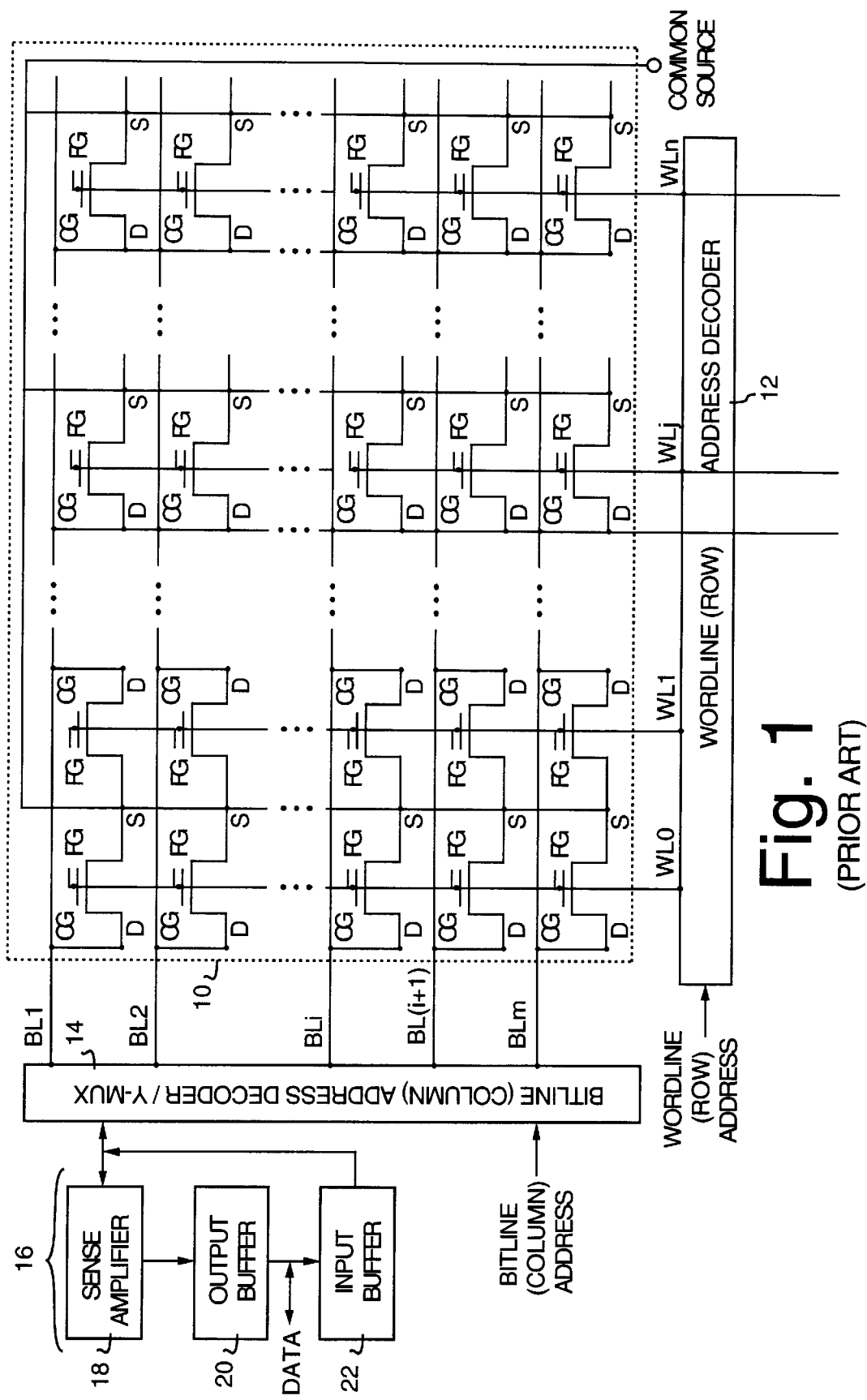
FIG. 1 is a block and schematic diagram of a prior art EEPROM memory array circuit, including associated circuitry for addressing and performing memory operations on the memory array circuit, wherein the structural orientation of the memory array circuit is schematically depicted.
Figure 2:
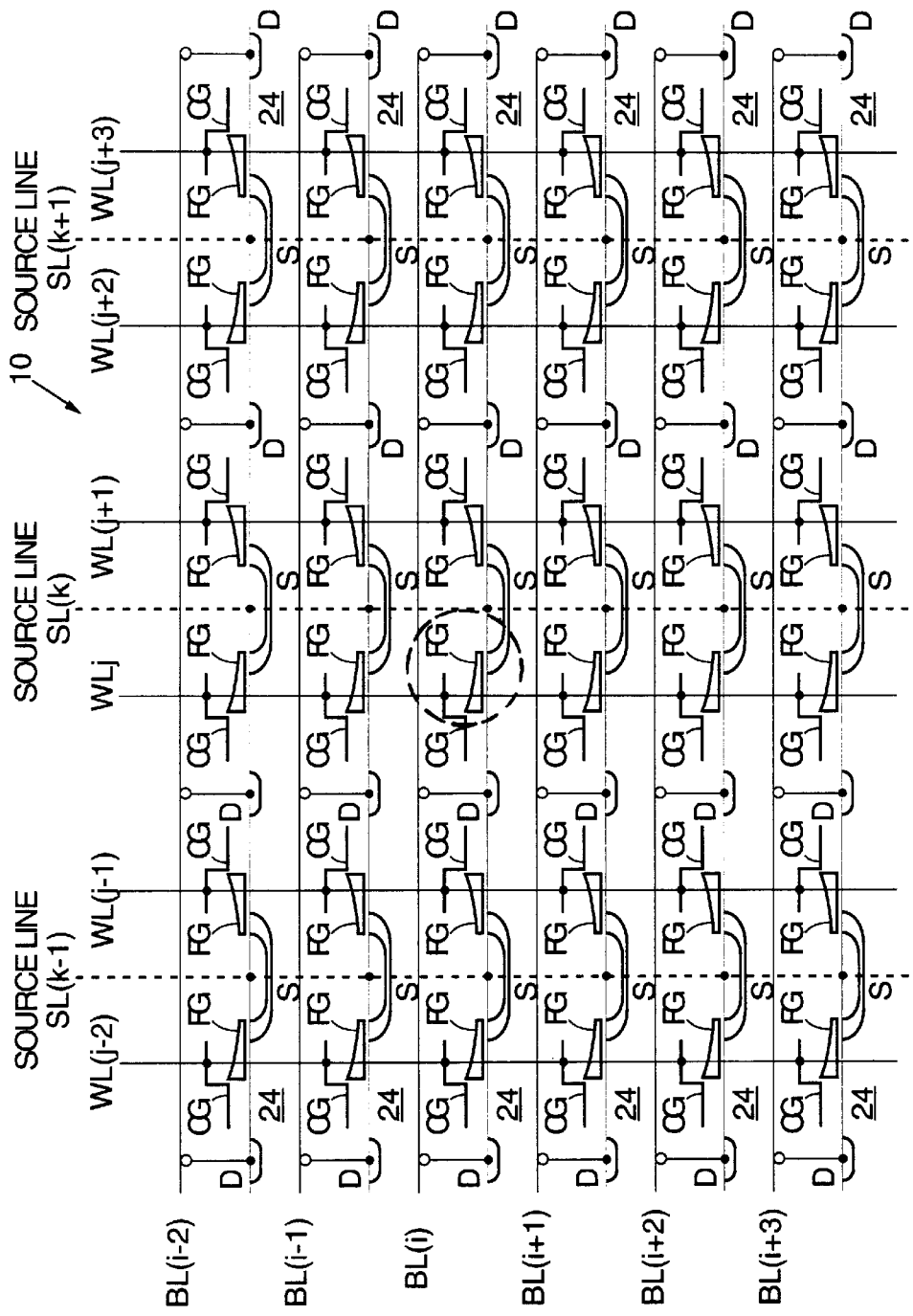
FIG. 2 is a structural and schematic diagram of the prior art EEPROM memory array circuit of FIG. 1.
Figure 3:
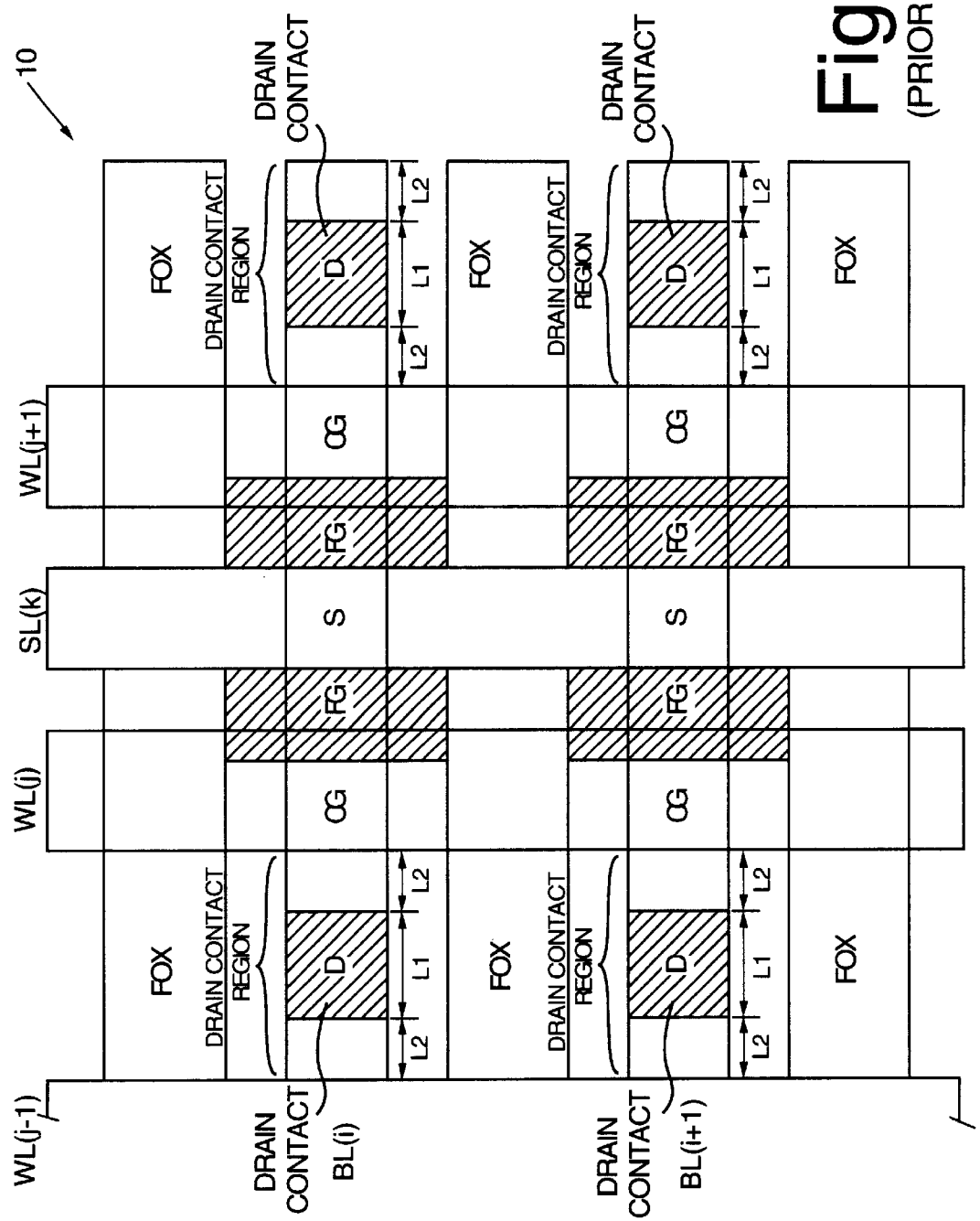
FIG. 3 is a top view of the prior art EEPROM memory array circuit of FIG. 1.

Referring to both FIGS. 2 and 4, another notable difference between the semiconductor memory array 100 of the invention and the prior art semiconductor memory array 10 is the orientation of the wordlines and bitlines with respect to the orientation of the memory cell FETs. In the prior art semiconductor memory array 10, the bitlines extend in the same direction as the channel (in the lengthwise direction) of the memory cell FETs, and orthogonal to both the wordlines and the source lines which are parallel to each other and orthogonal to the channel of the FETs. This arrangement requires that the floating gates be fabricated as individual rectangles. With scaling toward smaller geometry, it becomes increasingly more difficult to avoid the corner rounding effects in forming the rectangular floating gates during the lithography and etching process. In contrast, in the semiconductor memory array 100 of the invention, the bitlines extend orthogonal to the channel of the memory cell FETs and to the wordlines, and parallel to the source lines. Thus, the bitlines and the wordlines in the memory array 100 of the invention are oriented 90 degrees apart from the bitlines and wordlines of the prior art memory array 10, with respect to the orientation of each memory cell FET. Given this arrangement, fabrication of the floating gates becomes simplified as well. In the architecture of this invention, the floating gates can be first patterned as elongated stripes along the direction of the source lines and bitlines. These stripes can be later separated into individual rectangular floating gates in the same etching step which defines the polysilicon word lines, where the floating gates are self-aligned to the wordline boundaries. By using this technique, floating gates can be fabricated using elongated stripes rather than the more difficult process of forming rectangular floating gates. In this manner, the problem of forming ever-smaller geometric rectangles with sharp corners is avoided and scaling toward smaller geometric devices is made much easier. The method for forming the floating gates is explained infra.

Figure 6:
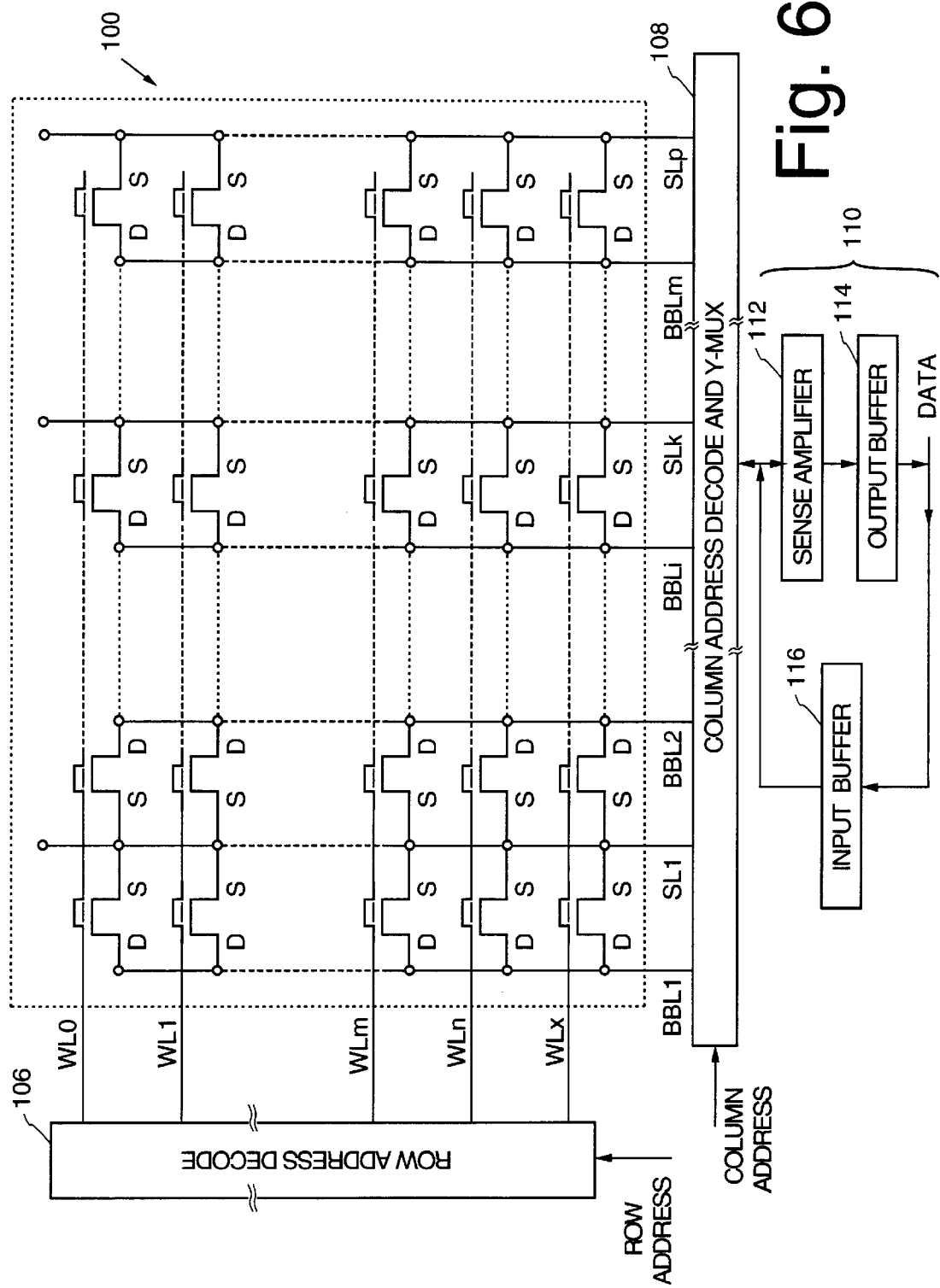
FIG. 6 is a block and schematic diagram of an EEPROM memory array circuit as per an embodiment of the invention, including associated circuitry for addressing and performing memory operations on the memory array circuit, wherein the structural orientation of the memory array circuit is schematically depicted.

Referring to FIG. 6, a block and schematic diagram of the EEPROM semiconductor memory array 100 is shown, along with associated circuitry for addressing and performing memory operations on the memory cells of the array. The semiconductor memory array 100 of the invention has its wordlines (WL1–WLn) coupled to the outputs of a row address decoder 106, and its bitlines (BBL1–BBLm) and source lines (SL1–SLp) coupled to the outputs of a column address decoder/Y-Mux 108. A memory operation circuit 110 is also included coupled to the column address decoder/Y-Mux 108, which comprises a sense amplifier 112, and input and output buffers 116 and 114.

The row address decoder 106 receives an input row address for selecting a particular row of memory cell FETs by way of the wordlines that includes the selected memory cell for which a memory operation is to be performed on. Also, the column address decoder/Y-Mux 108 receives an input column address for selecting a particular column of memory cell FETs by way of the bitlines and source lines that includes the selected memory cell for which a memory operation is to be performed on. Such memory operations include data writing, erasing, and reading.

Table 1 shown below lists the preferred voltages for performing the writing, erasing and reading operations on the memory cell FETs of the semiconductor memory array 100 of the invention.

TABLE 1

| LINES | WRITING | ERASING | READING |
|---|---|---|---|
| WL(j−x), x >= 1 | 0 | 0 | 0 |
| WL(j) | 2 V | 14 V | 4 V |
| WL(j+x), x >= 1 | 0 | 0 | 0 |
| BBL(i−x), x >= 1 | 0 | 0 | 2 V |
| BBL(i) | 0 | 0 | 2 V |
| BBL(i+x), x >= 1 | 5 V | 0 | 0 |
| SL(k−x), x >= 1 | 0 | 0 | 2 V |
| SL(k) | 12 V | 0 | 0 |
| SL(k+x), x >= 1 | 5 V | 0 | 0 |

Referring to Table 1, the writing, reading and erasing memory operations are to be performed on a selected memory cell FET common to wordline WL(j), bitline BL(i) and source line SL(k). This is the memory cell FET shown in FIG. 4 that has its floating gate (FG) encircled by a dash, circular line, and will be referred to herein as the selected memory cell.

The writing of a single memory cell is achieved by applying a 2-volt potential to the control gate and a 12-volt potential to the source, while grounding the drain. In this manner, the potential of the floating gate of the selected memory cell is raised to approximately 10 volts through its strong coupling to the source and weak coupling to the control gate. Hot electrons are generated in the channel region between the control gate and the floating gate where a strong electric field exists as a result of the structure and biasing of the memory cell. The high voltage on the floating gate also creates a favorable condition for the hot electrons to be injected onto the floating gate (FG) of the selected memory cell; thereby, writing a logical one (1) on the selected memory cell.

In writing to a selected memory cell in a memory array, care must be taken to avoid disturbance to other cells sharing a common conductive line with the selected memory cell. The biasing condition for a memory array is therefore dependent on the architecture of the memory array. For example, when a write memory operation is to be performed on the selected memory cell, besides the 2-volt potential applied to wordline WL(j) to turn on the channel under the control gate of the selected cell and the 12-volt potential applied to the source line SL(k), a 5-volt potential is applied to bitlines BBL(i+x), x>=1, and source lines SL(k+x), x>1, (all the bitlines and source lines to the source side of the selected memory cell) to prevent program disturbance to the cells sharing the same wordline WL(j). All other wordlines, bitlines and source lines are at ground potential. The 5-volt potential provides for reduced channel conduction in the unselected cells in order to prevent injection of electrons into the respective floating gates and thereby isolating the unselected cells from the writing memory operation.

When performing an erase memory operation on the selected memory cell, a 14-volt potential is applied to the wordline WL(j). All other wordlines, bitlines and source lines are at ground potential. The sharp edges of the floating gate enhance electron tunneling from the floating gate to the control gate which can be achieved at a relatively low potential. The 14-volt potential on the wordline WL(j) is sufficient to attract any charges on the floating gate (FG) of the selected cell, that they tunnel through the thin oxide layer separating the floating gate (FG) from the corresponding wordline WL(j). In fact, because the wordline WL(j) is coupled to each of the memory cell FETs in that row, all memory cell FETs common to wordline WL(j) are erased when the 14-volt potential is applied.

In reading a single memory cell, a 4-volt potential is applied to the control gate to turn on the channel under the control gate, a 2-volt potential is applied to the drain, and the source is grounded. If the floating gate is erased, i.e., without injected electrons, the selected memory cell will conduct a high current. If the floating gate is programmed, i.e., populated by injected electrons, the channel under the floating gate is turned off, and the selected memory cell will conduct very little or no current.

In conducting a read operation of the memory array, precautions again must be taken to avoid disturbance to unselected memory cells. When performing a reading memory operation on the selected memory cell, a 4-volt potential is applied to the wordline WL(j) to turn on the channel under the control gate of the selected cell, a 2-volt potential is applied to bitline BBL(i) to read out the current from the selected cell, and a 2-volt potential is applied to source lines SL(k−x), bitlines BBL(i−x), x>=1, (all the source lines and bitlines to the drain side of the selected memory cell which is the left side relative to this selected memory cell), to prevent conduction in the cells sharing the same word line WL(j). All other wordlines, bitlines and source lines are at ground potential. The 4-volt potential on wordline WL(j) enables the selected memory cell FET by way of its control gate (CG) to attain specified drain currents $I_{D0}$ and $I_{D1}$, wherein $I_{D0}$ is the drain current where there are insufficient charges on the floating gate (FG) that the selected memory cell is at a logical zero (0) state, and wherein $I_{D1}$ is the drain current where there are sufficient charges on the floating gate (FG) that the selected memory cell is at a logical one (1) state. The 2-volt potential on the bitline BBL(i) and the grounded potential on the source line SL(k) produces the drain current $I_D$ on the selected memory cell needed for sensing by the sense amplifier 112.

Because the wordline WL(j) is common to the corresponding row of memory cell FETs, each of those memory cell FETs are enabled for conduction by the 4-volt potential applied to their control gates (CG). However, most of those memory cell FETs will have their drains and sources at ground potential, so there is no drain current $I_D$ generated in them. Except that the cell adjacent to the selected memory cell having in common bitline BBL(i) has a drain potential of 2 volts applied to it. In order to prevent a drain current conduction in this unselected cell, a 2-volt potential is applied to its source line SL(k−x), x>=1, so that there is no potential difference between its drain and source. Therefore, no drain current results in this adjacent cell, thereby isolating it from the reading memory operation.

Fabricating the Gate Electrode

To improve the efficiency of the erase operation, it is critical to have floating gates with sharp injectory edges to enhance tunneling. FIGS. 7A through 7G show cross-sectional views of semiconductor device illustrating the fabrication steps for manufacturing floating gates with sharp injecting edges, where the floating gates can be manufactured in long stripe form or short rectangular form. Referring to FIG. 7A, a layer of thin oxide 202 is deposited on a silicon substrate 200, a layer of polycrystalline silicon or amorphous silicon ("polysilicon") 204 is then deposited on the thin oxide layer 202, and a layer of silicon dioxide 206 is deposited on the polysilicon layer 204. A layer of photoresist 208 is patterned on the silicon dioxide layer 206 to define the desired initial width of the floating gate. The gate oxide layer 202 is preferably thermally grown, with typical thickness between 100 Å to 200 Å and this thickness can be further reduced to below 50 Å for even smaller devices. The polysilicon layer 204 and the oxide layer 206 are preferably deposited by any number of conventional methods, with a typical thickness for each of the layers being between 1000 Å to 2000 Å. This thickness can also be reduced for smaller devices. The polysilicon layer 204 is doped by conventional ion implantation or furnace doping techniques.

Referring now to FIG. 7B, using the patterned photoresist 208 as a mask, the oxide layer 206 can be etched using conventional anisotropic oxide etching techniques. Referring now to FIG. 7C, after the removal of the oxide layer 206 not covered by the photoresist layer 208, the polysilicon layer 204 is then partially etched using conventional anisotropic polysilicon etching techniques. Note that it is desirable to leave a thin layer of the polysilicon layer unetched 203. The thickness of the remaining polysilicon layer is preferably between 100 Å to 500 Å. As will become clear by the illustrations in the next few figures, this remaining layer of polysilicon 203 will serve as a base layer for a second polysilicon layer to be deposited, and will also protect the gate oxide at the edge of the floating gate.

The photoresist layer is then removed, as shown in FIG. 7D. In FIG. 7E, a second layer of polysilicon (210, 212, 214, and 216), with a thickness preferably between 50 Å to 1000 Å, is deposited on the structure. An optional short dip in diluted HF solution can be carried out before the deposition of this second layer in order to improve the adhesion between the two layers of polysilicon. It may also be useful to dope the second layer of polysilicon with conventional ion implantation or furnace doping techniques. This doping step could be skipped if subsequent thermal cycles are long enough for the dopant to diffuse from the first layer of polysilicon to the second layer of polysilicon.

Referring now to FIG. 7F, an anisotropic polysilicon etching step is carried out to totally remove the polysilicon on the top of the oxide/polysilicon stack, to form polysilicon spacers on both sides of the oxide 214 and 216, and to totally remove the polysilicon on the thin oxide layer 202 outside the spacers and the mask of the oxide/polysilicon stack. As shown in FIGS. 7H and 7G, the oxide stack can be completely or partially removed to the desired height with the option to expose the sharp polysilicon injecting edges.

The sharpness of the polysilicon edges can be modified by thermal oxidation. It is known that certain oxidation conditions such as dry $O_2$ ambient and low oxidation temperatures tend to generate more stress during thermal oxidation and result in sharp corners and edges following the oxidation. Subsequent thermal oxidation steps will also allow polycrystalline grains formation which will integrate the edges to the floating gate. The sharpness of the poly edges can be adjusted by adjusting the thickness of the second polysilicon layer, and the height of the edges can be adjusted by the thickness of the oxide layer.

This method of forming a floating gate with sharp injecting edges where the sharpness and height of the edges can be easily adjusted is a self-alignment method. No lithographic step is needed and any possible alignment errors are avoided. The size of the floating gate and the cost of forming it can thus be kept at a minimum.

The process of incorporating the above floating gate with sharp injecting edges into a memory cell is illustrated in FIGS. 8A through 8F, which show the sequential steps of the preferred method of the present invention for forming a pair of adjacent memory cell FETs which can be used in the memory array of the present invention. The two adjacent memory cell FETs described as follows are representative of the adjacent memory cell FETs in the semiconductor memory array 100.

Figure 8A:
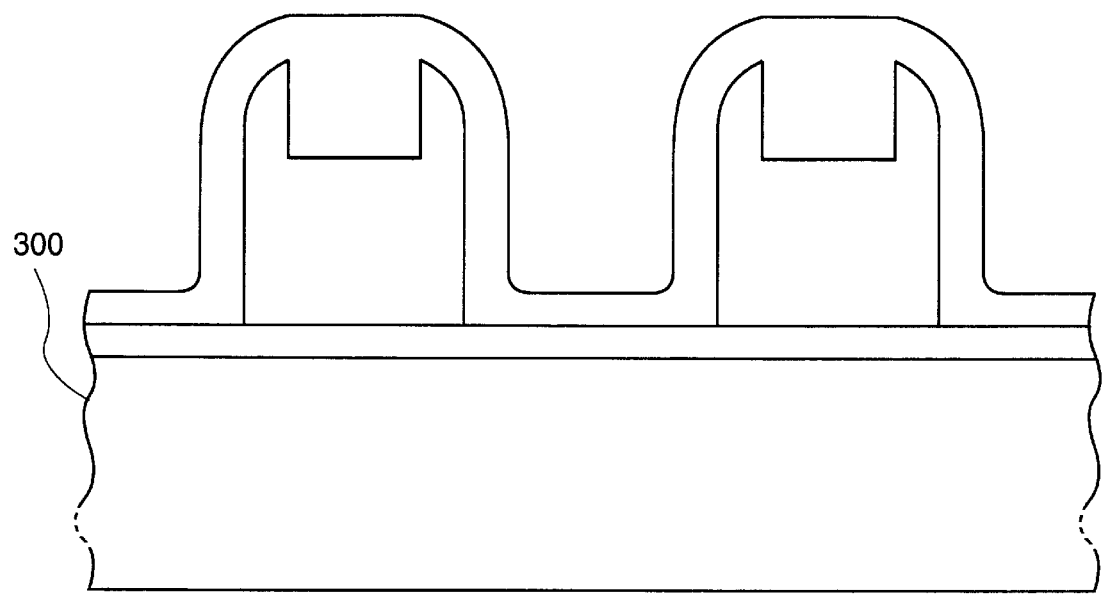

Referring to FIG. 8A, the method of forming a pair of adjacent memory cells, or alternatively, a pair of columns of adjacent memory cells, sharing a common source line, begins with the formation on a silicon substrate 300 two polysilicon floating gates with sharp injecting edges as described above and illustrated by FIGS. 7A through 7G. Although the floating gates could be patterned for each individual memory cells, these floating gates are first patterned as elongated stripes, where there is one stripe for each column of memory cells. An etching step to be described later will separate the floating gates for each row of the memory array. This patterning process avoids the problem associated with the corner rounding effects in defining small rectangular floating gates.

Figure 8B:
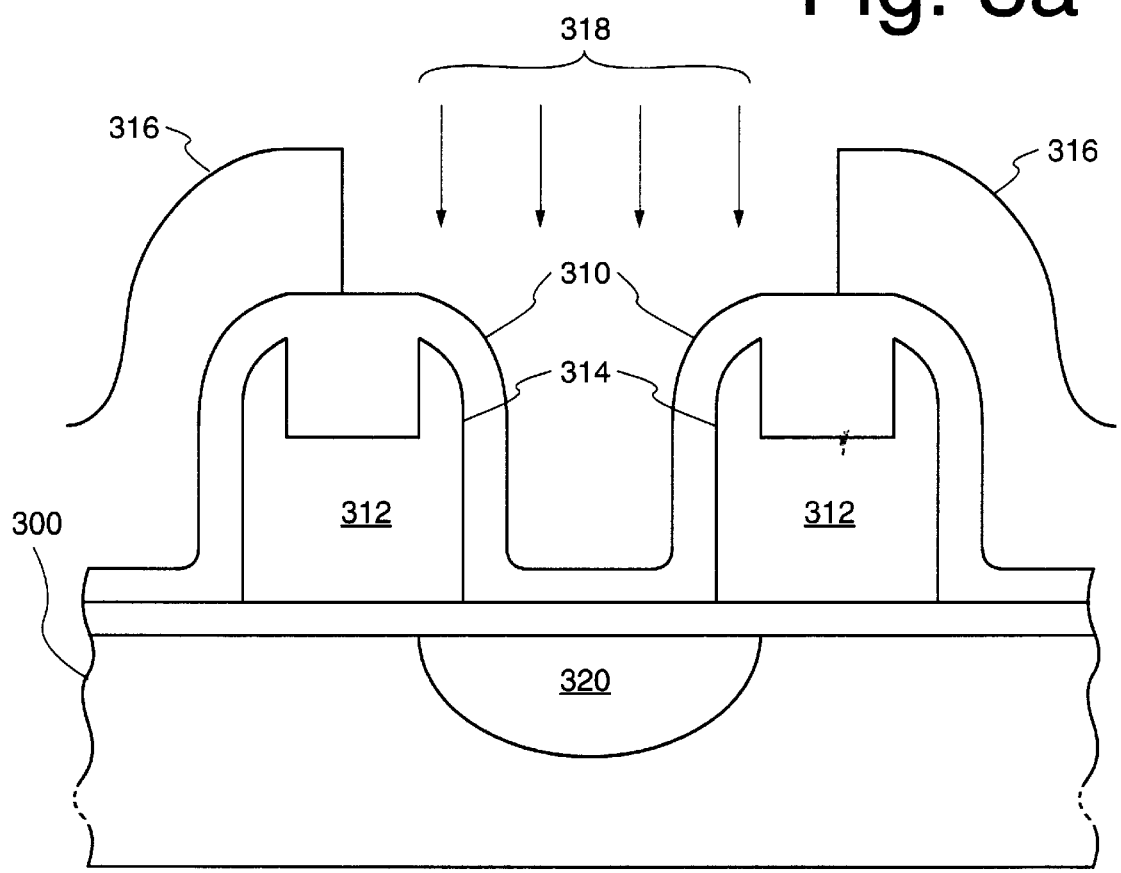

Referring to FIG. 8B, once the floating gate electrodes 312 and their corresponding sharp injecting edges 314 are formed and a layer of silicon dioxide is deposited over the entire structure, a layer of photo resist 316 is formed over the substrate 300 and the floating gate stacks 310, including the area on respective sides of the floating gate electrodes and their respective insulating layer. The photo resist 316 is then developed to form an ion implanting window 318 in the area between respective floating gate stacks 310 and partially over them. Application of one of the conventional ion implantation methods (illustrated by the plurality of downward pointing arrows) can be performed to form a first stage of an elongated diffused source region 320 within the substrate 300 coincident with the window 318. If a column of memory cell FETs are formed, the elongated diffused source region 320 is formed to extend within the substrate in the column-direction between respective floating gate stacks of every adjacent pairs of memory cell FETs in the column, thereby forming a continuous first stage elongated diffused source line that connects in common the source regions of each adjacent pairs of memory cell FETs in the column.

Figure 8C:
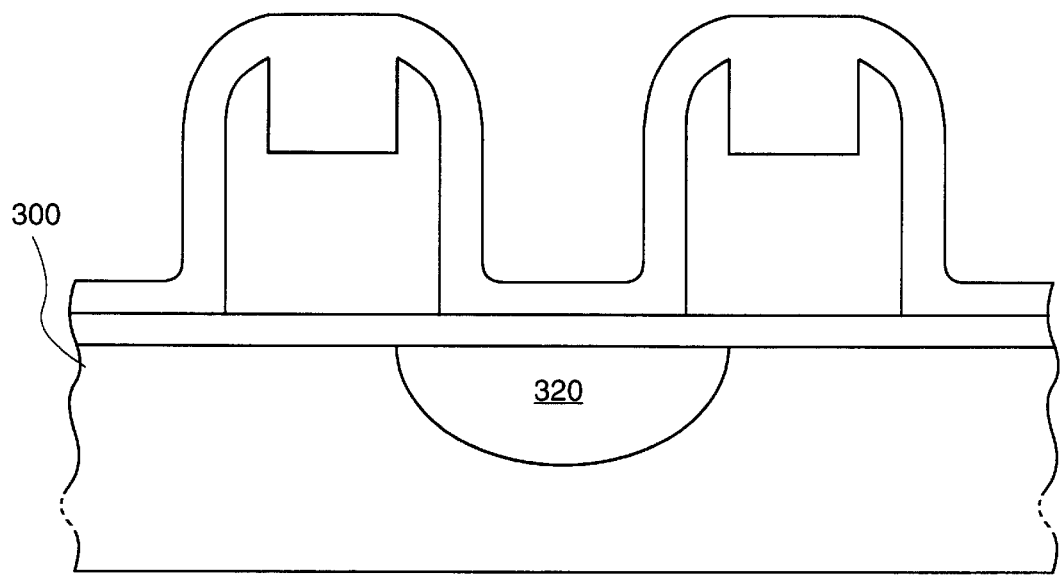

Referring to FIG. 8C, once the elongated diffused source region or line 320 is formed, the developed photo resist 316 is then removed. A thermal oxidation step is now carried to sharpen the injecting edges and drive in the dopants in the diffused source line. Sufficient overlap of the source line underneath the floating gates is required for the coupling of the source voltage to the floating gate.

Figure 8D:
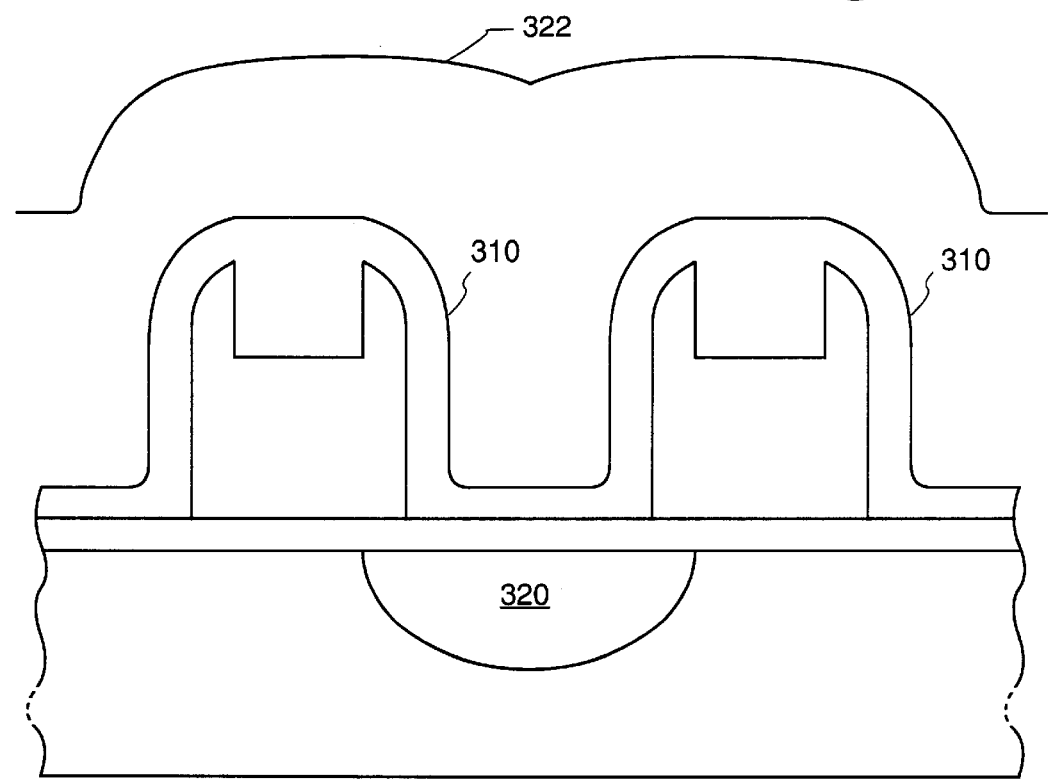

Referring to FIGS. 8D, a polysilicon layer 332 is deposited over the floating gate stacks 310 and then anisotropically etched to form polysilicon spacers as illustrated in FIG. 8E. Then, a conventional ion implantation step (illustrated by the plurality of downward pointing arrows) is performed, using the polysilicon spacers as self-aligned masks to form elongated diffused drain regions 326 and 328. The dimension of the polysilicon spacers will determine the channel length between the source region and the drain regions. The dimension of the polysilicon spacers are in turn determined by the thickness of the deposited polysilicon layer and the height of the floating gate stacks.

If a column of memory cell FETs are formed, the elongated diffused source region 320 and the elongated drain regions 326 and 328 are formed to extend continuously in the column-direction, thereby forming the elongated diffused drain and source regions that form the bitlines and source line of the columns of adjacent memory cell FETs.

Figure 8F:
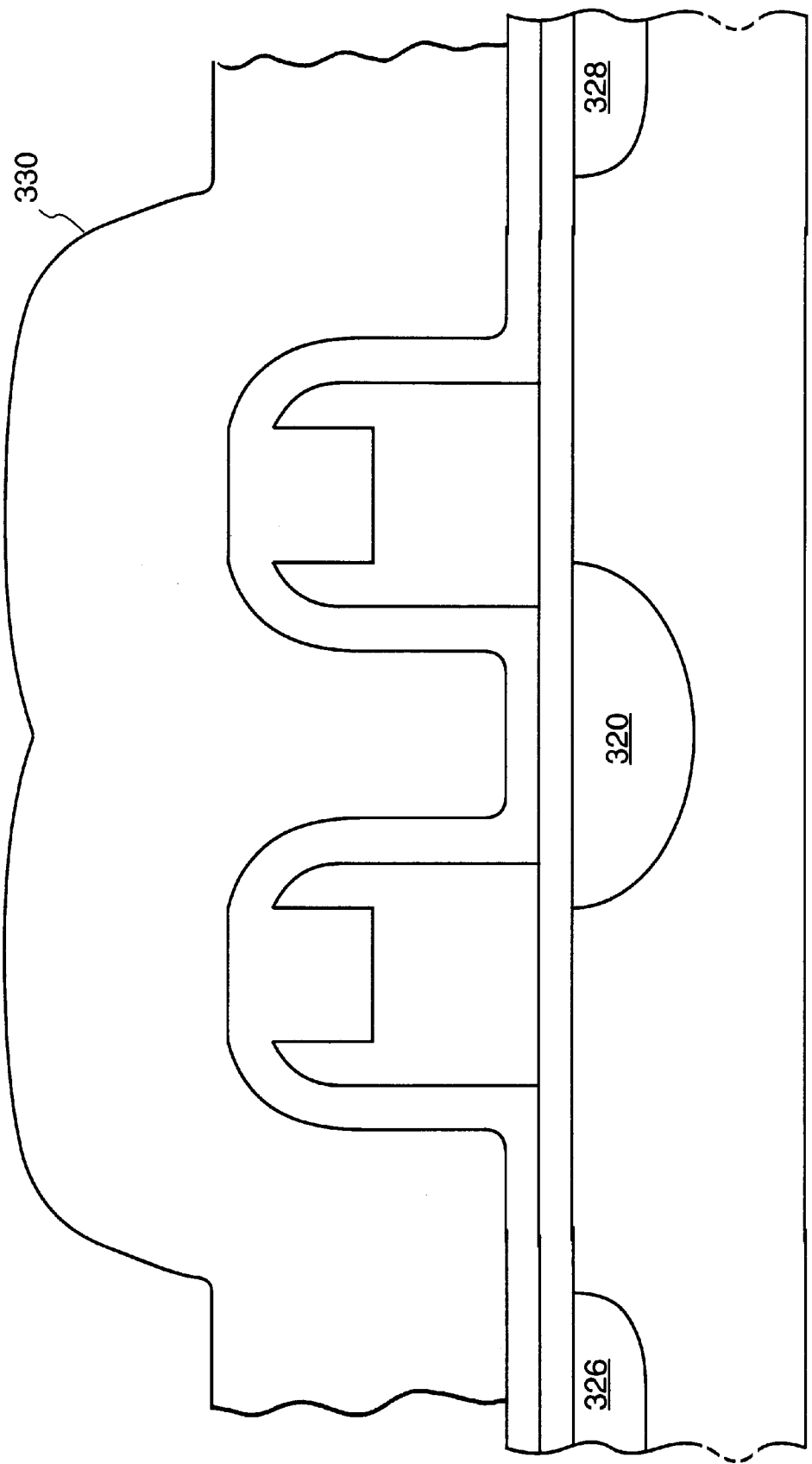

Referring to FIG. 8F, a layer of polysilicon 330 is formed over the oxidized layer and patterned to form an elongated conductive polysilicon line which serve as both the wordline and the control gates for the respective adjacent memory cells. The polysilicon spacer (formed as illustrated in FIG. 8E) could be left in place when the wordline polysilicon is deposited. Alternatively, the polysilicon spacers could be removed and a thin oxide layer is grown to form the gate oxide under the control gate, and then the control gate/word line polysilicon is deposited.

When the word line polysilicon layer is patterned and etched, the floating gates are also etched in the same step and aligned to the word line polysilicon to form separate floating gate for each memory cell in the column. This patterning process avoids the corner rounding effects in defining small rectangular floating gates.

Again, note the sharp edges of the floating gate electrodes, and the thin oxide layer that separates the floating gate electrode from the polysilicon wordline or control gate, this combination provides for strong electric fields to be generated during an erasing memory operation that causes the charges on the floating gate electrode to tunnel through the oxide to reduce the charges on the floating gate electrodes, thereby erasing the memory cell.

If a column of adjacent pairs of memory cell FETs are formed, the formation of the elongated conductive polysilicon line is formed for each pair of adjacent memory cells in the column. Field oxide layers may be conventionally formed to separate and isolate the adjacent pairs of memory cell FETs from other adjacent pairs of memory cell FETs in the column. As mentioned earlier, the steps of forming the adjacent memory cell FETs or column of memory cell FETs can be performed in a manner to form the EEPROM semiconductor memory array 100 of the invention.

Although the present invention has been described in detail with exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

It is claimed:

1. A method for forming a gate electrode for a semiconductor device, comprising the steps of:
    a) providing a substrate having a top surface;
    b) forming a first insulator layer over said top surface of said substrate;
    c) forming a first electrode layer over said first insulator layer;
    d) forming a second insulator layer over said first electrode layer;
    e) placing a mask of predefined size and shape over said second insulator layer;
    f) removing an unmasked portion of said second insulator layer, and leaving a remaining portion of said second insulator layer having at least two exposed opposite outer walls;
    g) removing a predefined amount of an unmasked portion of said first electrode layer, and leaving a remaining portion of said first electrode layer, said remaining portion of said first electrode layer including an unetched portion and a partially etched portion that overlies less than all of said unetched portion;
    h) removing said mask to expose a top surface of said second insulator layer;
    i) depositing a second electrode layer over said exposed top surface and over said exposed outer walls of said second insulator layer and also over said remaining portion of said first electrode layer; and
    j) removing a predefined amount of said second electrode layer to expose a top surface of said second insulator layer, whereby a remaining portion of said second electrode layer forms at least a portion of the gate electrode, and wherein a remaining portion of said second electrode layer disposed over said outer walls of said second insulating layer forms edges of the gate electrode, said edges having opposing inner walls that are substantially vertical to the plane of said substrate, each of said edges also having a sharp edge formed on a top surface thereof, said edges for facilitating electron tunneling.

2. A method as recited in 1 wherein said substrate includes silicon.

3. A method as recited in 1 wherein at least one of said first and second insulator layers consists of a material selected from the group including: silicon dioxide, silicon nitride, silicon oxynitride, and a combination thereof.

4. A method as recited in 1 wherein at least one of said first and second electrode layers consists of a material selected from the group including: polycrystalline silicon, amorphous silicon, silicon-germanium alloy, refractory metal, silicide, and a combination thereof.

5. A method as recited in 1 where in said step g) said predefined amount of the unmasked portion of said first electrode layer is a thickness between more than zero thickness to the full thickness of said first electrode layer.

6. A method as recited in 1 wherein in said step j) a predefined amount of said second electrode layer is removed to form spacers on both sides of said second insulator layer.

7. A method as recited in 1 further including a step of removing a predefined height of said second insulator layer for exposing said gate electrode.

8. A method as recited in 1 further including an oxidation step for sharpening said edges of said gate electrode.

9. A method as recited in 1 wherein a dry etching method is performed in removing insulating material of an insulator layer.

10. A method as recited in 1 wherein a dry etching method is performed in removing a portion of an electrode layer.

11. A method as recited in 1 wherein in step j) a predefined amount of said first electrode layer is removed.

12. A method for forming a gate electrode for a semiconductor device, comprising the steps of:
    a) providing a substrate having a top surface;
    b) forming a first insulator layer over said top surface of said substrate;
    c) forming a first electrode layer over said first insulator layer;
    d) forming a second insulator layer over said first electrode layer;
    e) placing a mask of predefined size and shape over said second insulator layer;
    f) removing an unmasked portion of said second insulator layer, and leaving a remaining portion of said second insulator layer having at least two exposed opposite outer walls;
    g) removing a predefined amount of an unmasked portion of said first electrode layer, and leaving a remaining portion of said first electrode layer, said remaining portion of said first electrode layer including an unetched portion and a partially etched portion that overlies less than all of said unetched portion;
    h) removing said mask to expose a top surface of said second insulator layer;
    i) depositing a second electrode layer over said exposed top surface and over said exposed outer walls of said second insulator layer and also over said remaining portion of said first electrode layer;
    j) removing a predefined amount of said second electrode layer to expose a top surface of said second insulator layer, whereby a remaining portion of said second electrode layer forms at least a portion of the gate electrode, and wherein a remaining portion of said second electrode layer disposed over said at least one of said outer walls of said second insulating layer forms an edge of the gate electrode, said edge extending upward substantially vertical to the plane of said substrate.

13. A method as recited in 12 further comprising an oxidation step for sharpening said edge of said gate electrode.

* * * * *